(12) United States Patent
Melton et al.

(10) Patent No.: US 8,189,732 B1
(45) Date of Patent: May 29, 2012

(54) NON-VOLATILE MEMORY COUNTER

(75) Inventors: Randall Wayne Melton, Colorado Springs, CO (US); Brad Phillip Garner, Colorado Springs, CO (US); Kerry David Maletsky, Monument, CO (US)

(73) Assignee: Atmel Corporation, San Jose, CA (US)

(*) Notice: Subject to any disclaimer, the term of this patent is extended or adjusted under 35 U.S.C. 154(b) by 9 days.

(21) Appl. No.: 12/948,528

(22) Filed: Nov. 17, 2010

(51) Int. Cl.
*G06M 3/00* (2006.01)
*H03K 23/00* (2006.01)

(52) U.S. Cl. .............. 377/26; 377/33; 377/52

(58) Field of Classification Search .............. None
See application file for complete search history.

(56) References Cited

U.S. PATENT DOCUMENTS

| | | | |
|---|---|---|---|
| 5,450,460 A * | 9/1995 | Stodieck | 377/44 |
| 6,687,325 B1 * | 2/2004 | Wells | 377/26 |
| 6,792,065 B2 * | 9/2004 | Maletsky | 377/34 |
| 6,922,456 B2 * | 7/2005 | Greenlaw et al. | 377/26 |

* cited by examiner

*Primary Examiner* — Tuan T Lam
(74) *Attorney, Agent, or Firm* — Fish & Richardson P.C.

(57) ABSTRACT

A counter is efficiently implemented in non-volatile memory by using two binary counters and selectively using one or the other as a current counter. Writes to the binary counters are minimized by using two linear counters and using the state of the binary counters to determine which binary counter contains the current count. Write operations can be performed to the "not current" binary counter with the final write operation being to the linear counters. The linear counter write operations can be in program-only mode so that a power failure will not result in a loss of counts.

20 Claims, 7 Drawing Sheets

|  | count | Lin A | Bin A | Lin B | Bin B | read Value |  |
|---|---|---|---|---|---|---|---|
| Reset Lin A | 0 | 1111 | 0000 | 0000 | 0000 | 11000000 | |
| Inc Lin A | 1 | 1110 | 0000 | 0000 | 0000 | 10000000 | |
| Inc Lin A | 2 | 1100 | 0000 | 0000 | 0000 | 11020000 | |
| Lin A | 3 | 1000 | 0000 | 0000 | 0000 | 10020000 | |
| Almost Full | | 1000 | 0000 | 0000 | 0000 (cpy a) | 11040001 | Bin A -> Bin B |
| | 4 | 1000 | 0000 | 1111 | 0000 | 11040001 | Reset Lin B |
| | | 0000 | 0000 | 1111 | 0000 | 11040001 | Inc Lin A |
| Inc Lin B | 5 | 0000 | 0000 | 1110 | 0000 | 10040001 | |
| Inc Lin B | 6 | 0000 | 0000 | 1100 | 0000 | 11060001 | |
| Lin B | 7 | 0000 | 0000 | 1000 | 0000 | 10060001 | |
| Almost Full | | 0000 | 0001 (a+1) | 1000 | 0000 | 11000001 | Bin A = Bin A + 1 |
| | 8 | 1111 | 0001 | 1000 | 0000 | 11000001 | Reset Lin A |
| | | 1111 | 0001 | 0000 | 0000 | 11000001 | Inc Lin B |
| Inc Lin A | 9 | 1110 | 0001 | 0000 | 0000 | 10000001 | |
| Inc Lin A | 10 | 1100 | 0001 | 0000 | 0000 | 11020001 | |
| Lin A | 11 | 1000 | 0001 | 0000 | 0000 | 10020001 | |
| Almost Full | | 1000 | 0001 | 0000 | 0001 (cpy a) | 11040002 | Bin A -> Bin B |
| | 12 | 1000 | 0001 | 1111 | 0001 | 11040001 | Reset Lin B |
| | | 0000 | 0001 | 1111 | 0001 | 11040001 | Inc Lin A |
| Inc Lin B | 13 | 0000 | 0001 | 1110 | 0001 | 10040002 | |
| Inc Lin B | 14 | 0000 | 0001 | 1100 | 0001 | 11060002 | |
| Lin B | 15 | 0000 | 0001 | 1000 | 0001 | 10060002 | |
| Almost Full | | 0000 | 0002 (a+1) | 0000 | 0001 | 11000002 | Bin A = Bin A + 1 |
| | 16 | 1111 | 0002 | 1000 | 0000 | 11000001 | Reset Lin A |
| | | 1111 | 0002 | 0000 | 0000 | 11000001 | Inc Lin B |
| | 17 | 1110 | 0002 | 0000 | 0001 | 10000002 | |

FIG. 4

|  | count | Lin A | Bin A | Lin B | Bin B | read Value |  |
|---|---|---|---|---|---|---|---|
| Reset Lin A | 0 | 1111 | 0000 | XXXX | XXXX | 11000000 |  |
| Inc Lin A | 1 | 1110 | 0000 | XXXX | XXXX | 10000000 |  |
| Inc Lin A | 2 | 1100 | 0000 | XXXX | XXXX | 11020000 |  |
| Lin A | 3 | 1000 | 0000 | XXXX | XXXX | 10020000 |  |
| Almost Full |  | 1000 | 0000 | XXXX | 0000 (cpy A) | 11040000 | Bin A -> Bin B |
|  | 4 | 1000 | 0000 | 1111 | 0000 | 11040000 | Reset Lin B |
|  |  | 0000 | 0000 | 1111 | 0000 | 11040000 | Inc Lin A |
| Inc Lin B | 5 | 0000 | 0000 | 1110 | 0000 | 10040000 |  |
| Inc Lin B | 6 | 0000 | 0000 | 1100 | 0000 | 11060000 |  |
| Lin B | 7 | 0000 | 0000 | 1000 | 0000 | 10060000 |  |
| Almost Full |  | 0000 | 0001 (B+1) | 1000 | 0000 | 11000001 | Bin A = Bin B + 1 |
|  | 8 | 1111 | 0001 | 1000 | 0000 | 11000001 | Reset Lin A |
|  |  | 1111 | 0001 | 0000 | 0000 | 11000001 | Inc Lin B |
| Inc Lin A | 9 | 1110 | 0001 | XXXX | 0000 | 10000001 |  |
| Inc Lin A | 10 | 1100 | 0001 | XXXX | 0000 | 11020001 |  |
| Lin A | 11 | 1000 | 0001 | XXXX | 0000 | 10020001 |  |
| Almost Full |  | 1000 | 0001 | XXXX | 0001 (cpy A) | 11040001 | Bin A -> Bin B |
|  | 12 | 1000 | 0001 | 1111 | 0001 | 11040001 | Reset Lin B |
| Inc Lin B |  | 0000 | 0001 | 1111 | 0001 | 11040001 | Inc Lin A |
| Inc Lin B | 13 | 0000 | 0001 | 1110 | 0001 | 10040001 |  |
| Lin B | 14 | 0000 | 0001 | 1100 | 0001 | 11060001 |  |
| Almost Full | 15 | 0000 | 0001 | 1000 | 0001 | 10060001 |  |
|  |  | 0000 | 0002 (B+1) | 1000 | 0001 | 11000002 | Bin A = Bin B + 1 |
|  | 16 | 1111 | 0002 | 1000 | 0001 | 11000002 | Reset Lin A |
|  |  | 1111 | 0002 | 0000 | 0001 | 11000002 | Inc Lin B |
|  | 17 | 1110 | 0002 | XXXX | 0001 | 10000002 |  |

FIG. 5

| | count | Lin A | Bin A | Lin B | Bin B | read Value | |
|---|---|---|---|---|---|---|---|
| Reset Lin A | 0 | 1111 | 0000 | XXXX | XXXX | 11000000 | |
| Inc Lin A | 1 | 1110 | 0000 | XXXX | XXXX | 10000000 | |
| Inc Lin A | 2 | 1100 | 0000 | XXXX | XXXX | 11020000 | |
| Lin A | 3 | 1000 | 0000 | XXXX | XXXX | 10020000 | |
| Almost Full | 4 | 1000 | 0000 | XXXX | 0000 (cpy A) | 11040000 | Bin A -> Bin B |
| | | 1000 | 0000 | 1111 | 0000 | 11040000 | Reset Lin B |
| | | 0000 | 0000 | 1111 | 0000 | 11040000 | Inc Lin A |
| Inc Lin B | 5 | 0000 | 0000 | 1110 | 0000 | 10040000 | |
| Inc Lin B | 6 | 0000 | 0000 | 1100 | 0000 | 11060000 | |
| Lin B | 7 | 0000 | 0000 | 1000 | 0000 | 10060000 | |
| Almost Full | 8 | 0000 | 0000 | 0000 | 0000 | 00060000 | Inc Lin B |
| | 9 | 0000 | 0001 (B+1) | XXXX | XXXX | 11000001 | Bin A = Bin B + 1 |
| | | 1111 | 0001 | XXXX | XXXX | 11000001 | Reset Lin A |
| Inc Lin A | 10 | 1110 | 0001 | XXXX | XXXX | 10000001 | |
| Inc Lin A | 11 | 1100 | 0001 | XXXX | XXXX | 11020001 | |
| Lin A | 12 | 1000 | 0001 | XXXX | XXXX | 10020001 | |
| Almost Full | 13 | 1000 | 0001 | XXXX | 0001 (cpy A) | 11040001 | Bin A -> Bin B |
| | | 1000 | 0001 | 1111 | 0001 | 11040001 | Reset Lin B |
| | | 0000 | 0001 | 1111 | 0001 | 11040001 | Inc Lin A |
| Inc Lin B | 14 | 0000 | XXXX | 1110 | 0001 | 10040001 | |
| Inc Lin B | 15 | 0000 | XXXX | 1100 | 0001 | 11060001 | |
| Lin B | 16 | 0000 | XXXX | 1000 | 0001 | 10060001 | |
| Almost Full | 17 | 0000 | XXXX | 0000 | 0001 | 00060001 | Inc Lin B |
| | 18 | 0000 | 0002 (B+1) | XXXX | XXXX | 11000002 | Bin A = Bin B + 1 |
| | | 1111 | 0002 | XXXX | XXXX | 11000002 | Reset Lin A |
| | 19 | 1110 | 0002 | XXXX | XXXX | 10000002 | |

FIG. 6

NON-VOLATILE MEMORY COUNTER

TECHNICAL FIELD

This subject matter is generally related to electronics, and more particularly to counters implemented in non-volatile memory.

BACKGROUND

Non-volatile memories (e.g., EEPROM) have two limitations that make simple counter storage difficult. A first limitation is that non-volatile memories have write endurance limits and can only be written a limited number of times before that location becomes unreliable. Typically, this limit is around one hundred thousand cycles. If a counter is incrementally written to non-volatile memory without any wear leveling the counter has an upper limit of 100K cycles.

A second limitation relates to power loss during the write operation. A typical EEPROM is written in two steps. The first step is an erase cycle (e.g., memory to all 1's) and the second step writes the data (e.g., 0's get written over by 1's). If power is lost during the erase/write cycle the memory location might be in an erased state or in a partially programmed state. This problem can be compounded when the memory locations span multiple bytes or pages.

SUMMARY

A counter is efficiently implemented in non-volatile memory by using two binary counters and selectively using one or the other as a current counter. Writes to the binary counters are minimized by using two linear counters and using the state of the linear counters to determine which binary counter contains the current count. Write operations can be performed to the "not current" binary counter with the final write operation being to the linear counters. The linear counter write operations can be in program-only mode so that a power failure will not result in a loss of counts.

Various implementations of the subject matter described herein may provide one or more of the following advantages: (1) the counter is space efficient; (2) the counter reduces the number of write operations to non-volatile memory; (3) the counter avoids time consuming check/repair operations; and (4) the counter will reliably increase the count or hold the current count value in the event of a power failure.

DESCRIPTION OF DRAWINGS

FIGS. 4-6 are tables illustrating operations performed during a count sequence according to three different example implementations.

DETAILED DESCRIPTION

Exemplary Memory System

Figure 1:
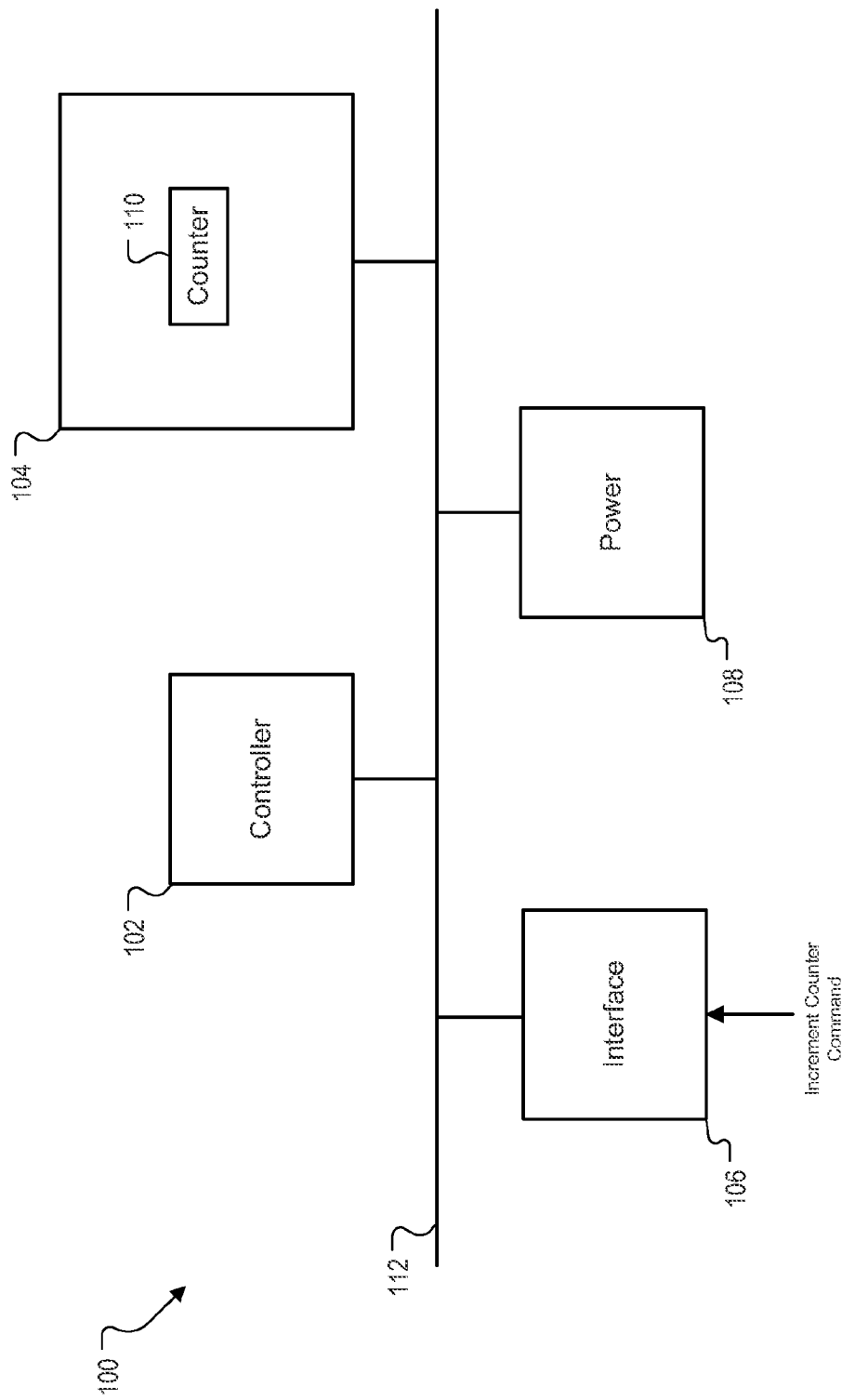
FIG. 1 is a schematic diagram of an exemplary memory system including a counter.

FIG. 1 is a schematic diagram of an exemplary memory system 100 including a counter. Memory system 100 can be an integrated circuit device that uses non-volatile memory to implement a counter. In some implementations, system 100 can include controller 102, non-volatile memory 104, interface 106 and power supply 108, each of which can communicate over bus 112. Non-volatile memory 104 can include counter 110.

In response to an increment counter command input at interface 106, counter 110 is incremented. The command can be received on one or more pins of an integrated circuit device. The command can be provided by an application or other system. Controller 102 can be, for example, a general purpose microprocessor or a memory controller. Interface 106 can include circuitry for receiving commands based on a protocol or instruction set. Power 108 can be any power source (e.g., a battery, power input pin). Non-volatile memory can be, for example, Electrically Erasable Programmable Read-Only Memory (EEPROM). Counter 110 is stored in non-volatile memory 104 and, in some implementations, can have the structure described in reference to FIG. 2.

Exemplary Data Structure for Counter

Figure 2:
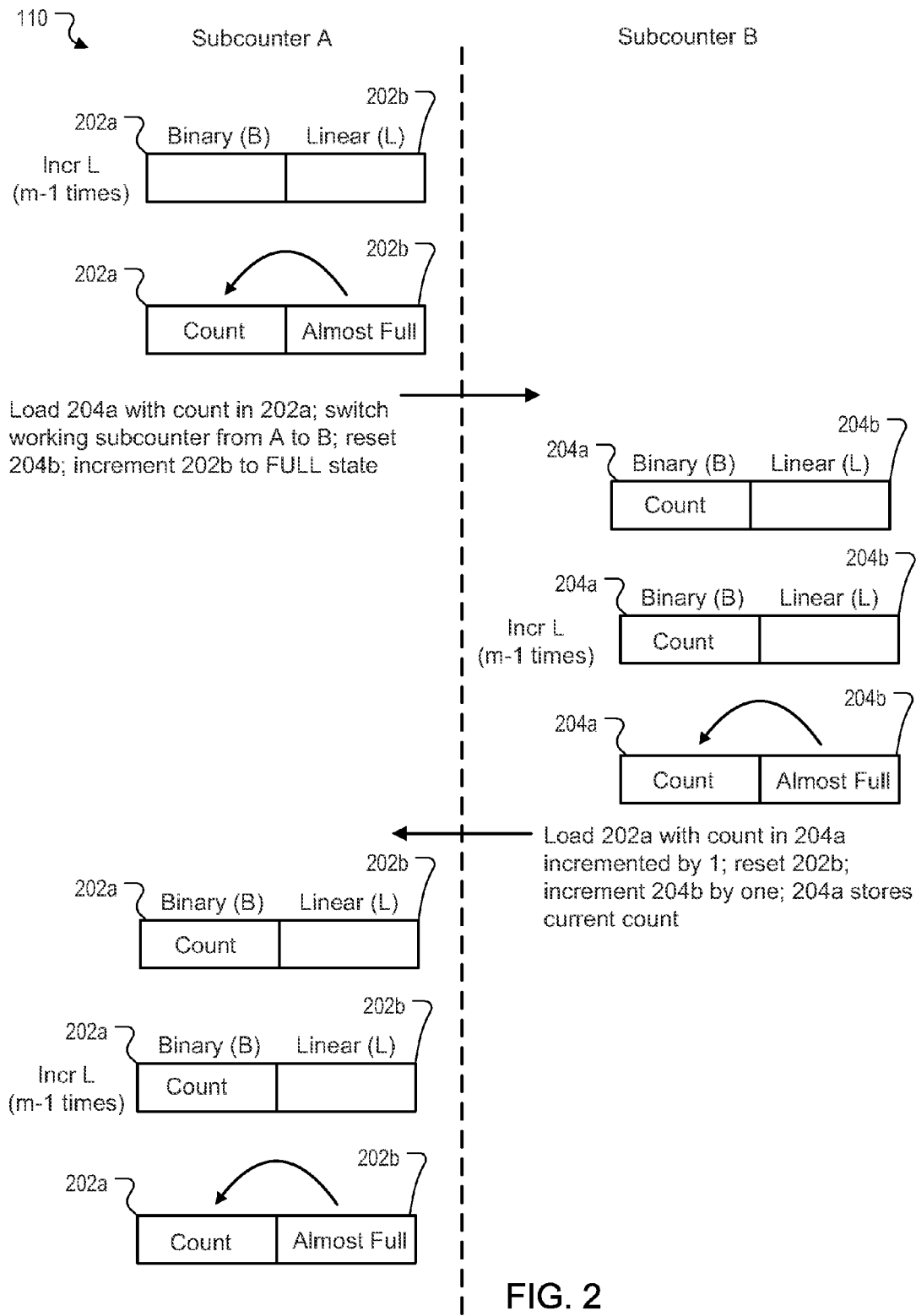
FIG. 2 illustrates an exemplary data structure for the counter of FIG. 1.

FIG. 2 illustrates an exemplary data structure for the counter of FIG. 1. In some implementations, counter 110 can include subcounter A and subcounter B. Subcounter A includes binary counter 202a and linear counter 202b and subcounter B includes binary counter 204a and linear counter 204b. Binary counters 202a, 204a are count limited to the nth power of 2, where n is an integer value representing a number of bits. Linear counters 202b, 204b are count limited to the number of bits m (e.g., 8, 16, 32 bits), where m is an integer value and can be a power of 2. In some implementations, n can be equal to m. In some implementations, linear counter writes can be made in program-only mode so that power failure will not result in information loss. In program-only mode if an erase step of non-volatile memory is omitted then modification can cause bits to transition from erased to programmed but not programmed to erase.

The example of FIG. 2, illustrates one cycle of toggling between subcounters A and B. In a practical implementation, the toggling between subcounters A and B would continue as illustrated in FIG. 2 until the count limits of the binary counters ($2^n$) is reached or counter 110 is otherwise reset. After reset, the toggling between subcounters A and B can resume. Counter 110 can be implemented in a combination of hardware and microcode. In the example shown, subcounter A is the current working counter and binary counter 204a and linear counter 204b holds the current count. In this example, it is assumed that linear counter 202b is initially reset (e.g., set to all "1"s).

Each time a request or command to increment counter 110 is received, linear counter 202b is incremented by one until linear counter 202b is in an almost full state. When linear counter 202b is almost full, binary counter 204a of subcounter B is loaded with the value of binary counter 202a, binary subcounter A now holds the current count of counter 110, linear counter 204b of subcounter B is reset (e.g., set to all "1"s), and linear counter 202b of subcounter A is incremented by one (e.g., last "1" bit is written to a "0") to indicate that linear counter 202b is now full.

When subcounter B is the working counter, linear counter 204b of subcounter B is currently counting. Each time a request or command to increment counter 110 is received, linear counter 204b is incremented by one until linear counter 204b is almost full. When linear counter 204b is almost full, binary counter 202a of subcounter A is loaded with the value of binary counter 204a incremented by one, linear counter 202b of subcounter A is reset (e.g., set to all "1"s), and linear counter 204b of subcounter B is incremented by one, binary subcounter 204a once again becomes the current count of counter 110.

In some implementations, an almost full state can be determined by monitoring the contents of the linear counters. For example, for a 16-bit linear counter, an EMPTY or reset state can be represented by FFFFh, a FULL state can be represented by 0000h and an ALMOST FULL state can be represented by 8000h, as described in more detail with respect to the example "C" code below. Incrementing linear counters 202b, 204b includes writing over a "1" with a "0" in the next most significant bit position of the linear counter. Thus, each increment of linear counter 202b or 204b requires a single write operation.

The structure of counter 110 described above is space efficient, limits the number of write operations to non-volatile memory, avoids time consuming check/repair operations, and provides a reliable, never decreased count in the event of a power failure.

Exemplary Process

Figure 3A:
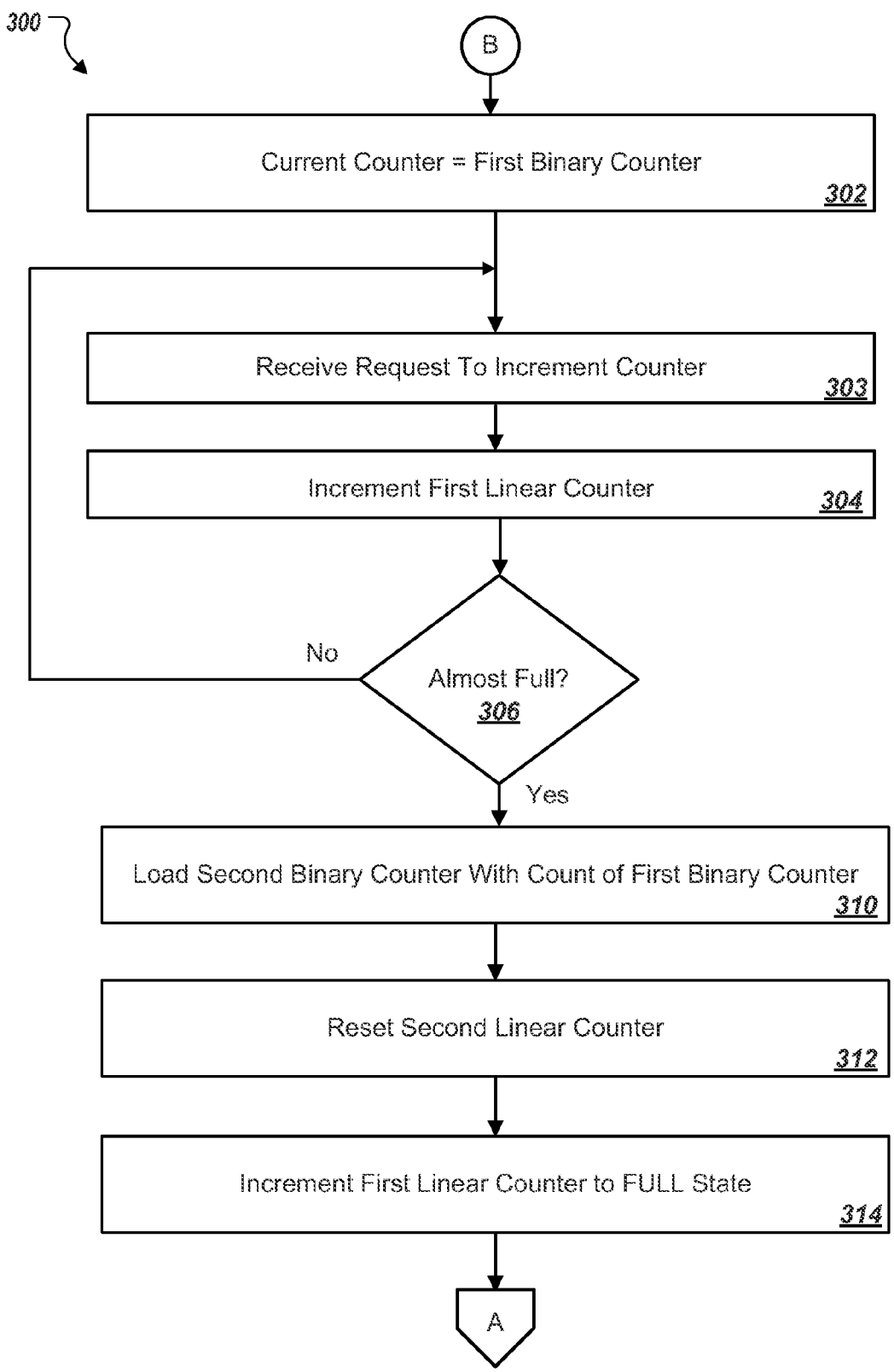
FIGS. 3A and 3B are flow diagrams of exemplary process for counting in memory using the counter data structure of FIG. 2.
Figure 3B:
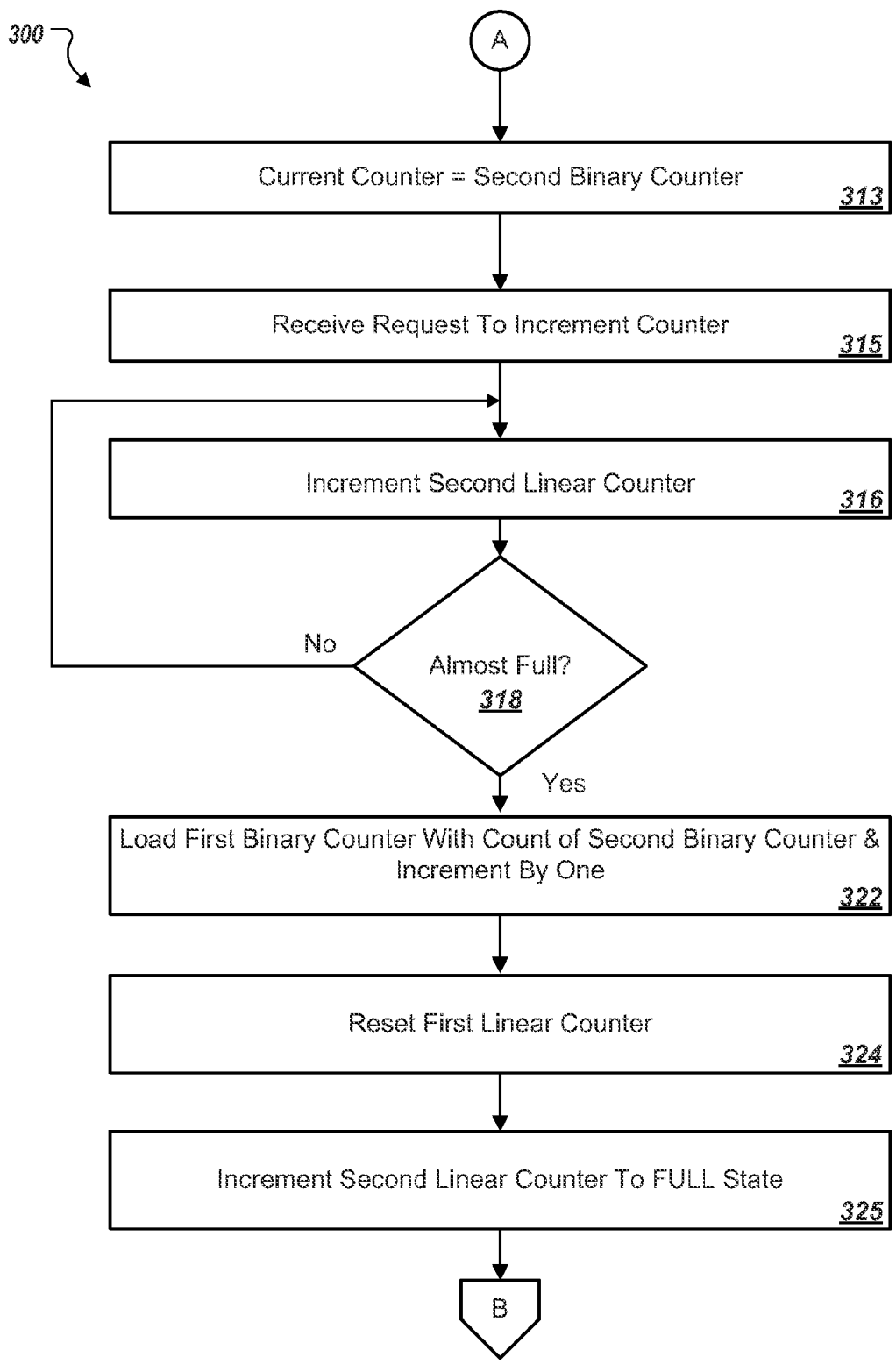

FIGS. 3A and 3B are flow diagrams of an exemplary process 300 for counting in memory using the counter 110 data structure of FIG. 2. The counter is stored in non-volatile memory, which has a limited write endurance (e.g., 100K cycles). In some implementations, counter 110 includes subcounter A and subcounter B. Subcounter A and subcounter B each include a binary counter and a linear counter. The binary and linear counters can be physically stored near each other in memory (e.g., contiguous memory) or in different memory locations. The linear counter can have a count limit of m, where m is an integer (e.g., m=16) equal to the number of bits. The binary counter can have a count limit of $2^n$, where n is an integer value equal to a number of bits.

Process 300 can be begin by designating a first subcounter (e.g., subcounter B) as storing a current count for counter (302). The current count is the count that is returned in response to a request. A request can be received from an application or system. Each time a request to increment the counter is received (303), a first linear counter of the first subcounter is incremented (304). The first linear counter increments by one until the first linear counter is in an almost full state (306). For example, the first linear counter can be almost full when a "0" is written to the m−1 bit position in an m-bit linear counter. An empty first linear counter indicates that subcounter A is the current counter.

If the first linear counter is almost full (306), the count of the first binary counter is loaded into a second binary counter of the second subcounter (310), the second linear counter is reset (312) and the first linear counter is incremented to a FULL state (e.g., incremented by 1) (314). The second binary counter is designated as storing the current count of the counter (313).

Each time a request to increment the counter is received (315), a second linear counter of the second subcounter is incremented (316). The second linear counter increments by one until the second linear counter is almost full (318). For example, the first linear counter can be almost full when a "0" is written to the m−1 bit position in an m-bit linear counter. An empty second linear counter indicates that subcounter B is the current counter.

If the second linear counter is almost full (318), the first binary counter of the first subcounter is incremented by one (320), the count of the second binary counter+1 is loaded into the first binary counter (322), the first linear counter is reset (324) and the second linear counter is optionally incremented to a FULL state (e.g., incremented by 1) (325). The first binary counter is designated as storing the current count of the counter (302).

The process 300 continues until both the first and second binary counters become full. If n is selected to be sufficiently large for the desired application, the binary counters will likely not become full during the lifetime of the application. Example implementation of process 300 can be implemented in "C" code as follows:

```
// Counters
#defineNUM_COUNTER      16
#defineSIZE_BINARY       2
#defineNUM_BINARY        2
#defineSIZE_LINEAR       2
#defineNUM_LINEAR        2
struct s_eeCounter {
        ushort linear[NUM_LINEAR];
        ushort binary[NUM_BINARY];
};
struct s_eeCounter counter[NUM_COUNTER];
#defineABIN    1
#defineALIN    0
#defineBBIN    0
#defineBLIN    1
#define FULL 0x0000
#define ALMOSTFULL 0x8000
#define EMPTY 0xFFFF
// Increment a linear counter
void
incrLinear(ushort *x)
{
    *x = *x & ((*x << 1) & 0xFFFE);
}
// Increment the specified counter, return false if counter is already at its limit
// or some sort of sanity error.
int
incrCounter(int countId)
{
        struct s_eeCounter *ctr;
        if (countId > NUM_COUNTER) return false;
        ctr = &counter[countId];
```

```
        // At the limit?
        if ((ctr->binary[ABIN] == 0xFFFF) && (ctr->binary[BBIN] == 0xFFFF) &&
            (ctr->linear[BLIN] == ALMOSTFULL) && (ctr->linear[ALIN] ==
FULL))
              {error("Counter at Limit"); return false; }
        if (ctr->linear[ALIN] == ALMOSTFULL)
    {
        ctr->binary[BBIN]= ctr->binary[ABIN];
        ctr->linear[BLIN]= EMPTY;
        ctr->linear[ALIN]= FULL;
    }
    else if (ctr->linear[ALIN] != FULL)
        incrLinear(&ctr->linear[ALIN]);
    else // linear[ALIN] is full
    {
        if (ctr->linear[BLIN] == ALMOSTFULL)
        {
           ctr->binary[ABIN]= ctr->binary[BBIN]+1;
           ctr->linear[ALIN]= EMPTY;
           ctr->linear[BLIN]= FULL;
        }
        else if (ctr->linear[BLIN] != FULL)
           incrLinear(&ctr->linear[BLIN]);
        else // A is full and B is full. This should never happen
           { error("A&B Both Full in IncrCounter"); return false; }
    }
    return true;
}
```

In the example code above the states of linear counts are defined as FULL=0000h, EMPTY=FFFFh and ALMOST FULL=8000h. Each time a request or command to increment the counter is received a write operation is performed on a linear counter, where a "1" is overwritten with a "0." For example, for a 4-bit linear counter, the contents of the linear counter after each increment request is fulfilled would be: 1110, 1100, 1000, where an ALMOST FULL state would occur when the count was 1000 or 8h. Some implementations may automatically initialize a counter to a logical 0 state from a default manufacturing value for the memory.

The above example code implements the counter data structure and process described in reference to FIGS. 2 and 3. The example code also includes various methods for handling potential errors, such as when counters reach their count limit.

Process 300 and the example code described above provides an efficient non-volatile memory counter that is space efficient, limits the number of write operations to non-volatile memory, avoids time consuming check/repair operations, and provides a reliable count in the event of a power failure.

FIGS. 4-6 are tables 400, 500, 600 illustrating operations performed during a count sequence according to three different example implementations. In these example count sequences, two binary counters and two linear counters are used. Lin A and Bin A are linear and binary counters, respectively, of subcounter A, and Lin B and Bin B are linear and binary counters, respectively, of subcounter B. Read Value is the value read from the counter by an application reading the counter from the counter. A text description for each operation is shown next to the operation and both sides of the table. Operations that relate to the transition between subcounters A and B are shown on the right side of each table. In some implementations, the result of a read counter value operation that is shown in column sixth of FIGS. 4-6 has the following format:

| RESULT—Read Counter Value | | | |
|---|---|---|---|
| Memory Byte Address | | | |
| 0 | 1 | 2 | 3 |
| Value Lin CNT byte | Flag byte | Binary CNT(LSB) | Binary CNT(MSB) |

The Flag byte indicates which byte of the linear counters is returned. For some implementations, 1 byte of a linear counter out of a possible 4 bytes is returned (e.g., 2 bytes for the first linear counter, 2 bytes for the second linear counter). The Flag byte is used to determine which byte has been returned.

Referring to Table 400, at step 0 Lin A is reset to all "1"s and then incremented for steps 1 and 2 until almost full at step 3. During this time, Bin B stores the current count of the counter, which is 0 for this example. At step 4, the contents of Bin A is copied into Bin B, Lin B is reset to all "1"s and Lin A is incremented by one so that it becomes full. At this point, Bin A stores the current count of the counter.

Lin B is incremented for steps 5 and 6 until almost full at count 7. At count 7, the count of Bin A is incremented by one, Lin A is reset to all "1"s and Lin B is incremented by one so that it becomes full. Bin B once again stores the current count of the counter. This process repeats for steps 8-17.

Referring to Table 500, at step 0 Lin A is reset to all "1"s and then incremented for steps 1 and 2 until almost full at step 3. During this time, Bin B stores the current count of the counter, which is 0 for this example. At step 4, the contents of Bin A is copied into Bin B, Lin B is reset to all "1"s and Lin A is incremented by one so that it becomes full. At this point, Bin A stores the current count of the counter.

Lin B is incremented for steps 5 and 6 until almost full at count 7. At step 7, the contents of Bin B is moved into Bin A and incremented by one, Lin A is reset to all "1"s and Lin B is incremented by one so that it becomes full. Bin B once again stores the current count of the counter. This process repeats for steps 8-17.

Referring to Table 600, at step 0 Lin A is reset to all "1"s and then incremented for counts 1 and 2 until almost full at count 3. During this time, Bin B stores the current count of the counter, which is 0 for this example. At step 4, the contents of Bin A is copied into Bin B, Lin B is reset to all "1"s and Lin A is incremented by one so that it becomes full. At this point, Bin A stores the current count of the counter.

Lin B is incremented for steps 5 and 6 until almost full at count 7. At count 7, Lin B is incremented by one so that it becomes full. Bin A stores the count from Bin B incremented by one. Lin A is reset to all "1"s. This process repeats for steps 8-17.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

What is claimed is:

1. A method comprising:
   designating a first subcounter of a counter as a working counter, where the counter is implemented in non-volatile memory;
   designating a second subcounter of the counter as storing a current count of the counter;
   incrementing a first linear counter associated with the first subcounter until the first linear counter reaches an almost full state;
   incrementing a first binary counter associated with the first subcounter;
   incrementing a second binary counter associated with the second subcounter;
   resetting the first linear counter;
   designating the second subcounter as the working counter; and
   designating the first subcounter as storing the current count of the counter.

2. The method of claim 1, further comprising:
   incrementing a second linear counter of the second subcounter until the second linear counter reaches an almost full state;
   incrementing the second binary counter;
   resetting the second linear counter;
   designating the first subcounter as the working counter; and
   designating the second subcounter as storing the current count of the counter.

3. The method of claim 1, further comprising determining an almost full state by monitoring contents of the first linear counter.

4. The method of claim 1, further comprising determining an almost full state by monitoring a data structure physically separate from the first linear counter.

5. The method of claim 2, further comprising determining an almost full state by monitoring contents of the second linear counter.

6. The method of claim 2, further comprising determining an almost full state by monitoring a data structure physically separate from the second linear counter.

7. The method of claim 1, where the non-volatile memory is Electrically Erasable Programmable Read-Only Memory.

8. The method of claim 2, where the first and second binary counters have n bits and count to a value of $2^n$ and the first and second linear counters have m bits, where n and m are integer values.

9. The method of claim 2, where the first and second linear counters are incremented in a program-only mode.

10. A system, comprising:
    non-volatile memory storing a counter;
    a controller coupled to the memory and configured to execute instructions to perform operations comprising:
    designating a first subcounter of the counter as a working counter;
    designating a second subcounter of the counter as storing a current count of the counter;
    incrementing a first linear counter associated with the first subcounter until the first linear counter reaches an almost full state;
    incrementing a first binary counter associated with the first subcounter;
    incrementing a second binary counter associated with the second subcounter;
    resetting the first linear counter;
    designating the second subcounter as the working counter; and
    designating the first subcounter as storing the current count of the counter.

11. The system of claim 10, where the controller is configured to execute instructions to perform operations comprising:
    incrementing a second linear counter of the second subcounter until the second linear counter reaches an almost full state;
    incrementing the second binary counter;
    resetting the second linear counter;
    designating the first subcounter as the working counter; and
    designating the second subcounter as storing the current count of the counter.

12. The system of claim 10, where the controller is configured to execute instructions to perform operations comprising:
    determining an almost full state by monitoring contents of the first linear counter.

13. The system of claim 10, where the controller is configured to execute instructions to perform operations comprising:
    determining an almost full state by monitoring a data structure physically separate from the first linear counter.

14. The system of claim 11, where the controller is configured to execute instructions to perform operations comprising:
    determining an almost full state by monitoring contents of the second linear counter.

15. The system of claim 11, further comprising determining an almost full state by monitoring a data structure physically separate from the second linear counter.

16. The system of claim 10, where the non-volatile memory is Electrically Erasable Programmable Read-Only Memory.

17. The system of claim 11, where the first and second binary counters have n bits and count to a value of $2^n$ and the first and second linear counters have m bits, where n and m are integer values.

18. The system of claim 11, where the first and second linear counters are incremented in a program-only mode.

19. The system of claim 10, further comprising:
an interface coupled to the controller and configured to receive a request to increment the counter.

20. The system of claim 10, where the system is incorporated in an integrated circuit device.

* * * * *

UNITED STATES PATENT AND TRADEMARK OFFICE
CERTIFICATE OF CORRECTION

PATENT NO. : 8,189,732 B1  
APPLICATION NO. : 12/948528  
DATED : May 29, 2012  
INVENTOR(S) : Randall Wayne Melton, Brad Phillip Garner and Kerry David Maletsky Page 1 of 1

It is certified that error appears in the above-identified patent and that said Letters Patent is hereby corrected as shown below:

Title page, insert Item (65)

--(65)  Prior Publication Data

US 2012/0121060 A1    May 17, 2012--

Signed and Sealed this  
Eleventh Day of June, 2013

Teresa Stanek Rea  
*Acting Director of the United States Patent and Trademark Office*